United States Patent [19]
Keefe

[11] 4,164,029
[45] Aug. 7, 1979

[54] APPARATUS FOR HIGH DENSITY BUBBLE STORAGE

[75] Inventor: George E. Keefe, Montrose, N.Y.

[73] Assignee: International Business Machines Corporation, Armonk, N.Y.

[21] Appl. No.: 839,720

[22] Filed: Oct. 5, 1977

Related U.S. Application Data

[63] Continuation of Ser. No. 645,975, Dec. 31, 1975, abandoned.

[51] Int. Cl.² .................................... G11C 19/08
[52] U.S. Cl. .................................... 365/36; 365/15; 365/29; 365/12
[58] Field of Search ...................... 427/127–132, 427/48; 428/900; 365/4, 14, 5, 15, 16, 8, 36, 41

[56] References Cited

U.S. PATENT DOCUMENTS

| | | | |
|---|---|---|---|
| 3,618,054 | 11/1971 | Bonyhard et al. | 365/16 X |
| 3,691,540 | 9/1972 | Almasi et al. | 365/8 |
| 3,701,125 | 10/1972 | Chang et al. | 365/5 |
| 3,828,329 | 8/1974 | Fischer et al. | 365/36 |
| 3,967,002 | 6/1976 | Almasi et al. | 365/41 |
| 4,040,019 | 8/1977 | Bullock | 365/36 |

OTHER PUBLICATIONS

IBM Technical Disclosure Bulletin, vol. 18, No. 4, Sep. 1975, pp. 1274–1275.

Primary Examiner—James W. Moffitt
Attorney, Agent, or Firm—Jackson E. Stanland

[57] ABSTRACT

A magnetic bubble storage system and a method for making it using only two masking steps, one of which is critical. In a preferred embodiment, the storage regions are comprised of ion implanted propagation elements which can be contiguous with one another. The functions of write, read, storage, transfer between storage elements in different shift registers, and annihilation are provided by the method in which the same mask is used to define ion implanted regions and for formation of conductor metallurgy. Permalloy bridges over ion implanted regions are used to provide transfer of information between one storage element and another. In a preferred embodiment, NiFe is used for sensing, annihilation, and transfer of information, while the storage registers are comprised of ion implanted regions defining contiguous propagation elements of generally circular geometry.

29 Claims, 7 Drawing Figures

APPARATUS FOR HIGH DENSITY BUBBLE STORAGE

This is a continuation of application Ser. No. 645,975 filed Dec. 31, 1975, and now abandoned.

CROSS REFERENCE TO RELATED APPLICATIONS

Ser. No. 537,797 in the name of G. S. Almasi et al, filed Dec. 31, 1974, now U.S. Pat. No. 3,967,002, describes a method for making a high density magnetic bubble domain storage system in which three masking steps are required, one of which requires critical alignment. In that process, magnetic disks of soft magnetic material, such as NiFe, are part of the ion implantation mask and will not interfere with propagation by ion implanted regions. Thus, the magnetic disks define ion implantation masks as well as providing functions such as generation, propagation, reading and annihilation.

BACKGROUND OF THE INVENTION

1. Field of the Invention

This invention relates to a high density bubble domain memory and a method for making it, and in particular to an improved method for making such a memory using only two masking steps, one of which requires critical alignment.

2. Description of the Prior Art

Various systems using magnetic bubble domains are known in the art. For example, self-contained magnetic bubble domain memory chip using a decoder is shown in U.S. Pat. No. 3,701,125. Additionally, a major/minor loop memory configuration is shown in U.S. Pat. No. 3,618,054. In these memory systems, components are required which provide the functions of read, write, bubble domain propagation, transfer between storage elements, and annihilation. That is, bubble domains are generated for representation of information, and these bubble domains are generally propagated in the memory. After propagation, they are read and then annihilated or returned to their storage locations. Furthermore, these memories often require transfer functions where bubble domains are transferred from one propagation path to another, usually by the use of current carrying loops that produce magnetic field gradients for implementing the transfer.

Many components are known in the art for generating magnetic bubble domains and for detecting magnetic bubble domains. For example, a magnetoresistive sensing technique is shown in U.S. Pat. No. 3,691,540. For the function of storage, bubble domains are generally propagated using any of many well known structures. In particular, ion implanted propagation elements having generally curved paths are useful for bubble domain storage, since the line widths of these elements are generally about four bubble diameters, thereby leading to relaxed lithography requirements. Such ion implanted structures are described by R. Wolfe et al in the AIP Conference Proceedings, No. 10, Part 1, p. 339 (1973). These proceedings contain the text of the papers delivered at the 18th Annual Conference on Magnetism and Magnetic Materials, held in Denver, Colo., in 1972. Furthermore, U.S. Pat. No. 3,828,329 describes propagation structures using ion implanted regions.

The processes used for making magnetic bubble domain chips have developed through the years so that single level masking techniques are now described for making bubble domain memories in which the propagation elements are separated from one another (gapped propagation elements). In such techniques, magnetic sensors are deposited using the same mask that is used for depositing the magnetic propagation elements. Also, since the propagation elements are not in contact with one another, conductors can be placed directly over the propagation elements without shorting any electrical currents. This means that the bubble domain chip can be fabricated using only a single critical masking step.

However, with the exception of aforementioned Ser. No. 537,797, (U.S. Pat. No. 3,967,002) the prior art does not address the problem of making high density magnetic bubble domain chips where the propagation elements are contiguous to one another. In such systems it is difficult to place conductors directly on the propagation elements, since electrical shorting may occur. Additionally, several critical masking steps are usually required in order to define the sensors, propagation elements, and conductors used for bubble domain transfer and sensor current. Furthermore, it is usually necessary to provide a "protect" mask to protect the magnetoresistive sensor when the electrical conductors are formed. Because these are critical problems when bubble domain technology is to be used to provide economical memory structures having high density, the present invention seeks to provide an improved bubble domain memory in which all necessary functions are provided, and which can be made by a process using a minimum number (two) of masking steps, only one of which requires critical alignment.

Accordingly, it is a primary object of this invention to provide an improved process for fabricating high density magnetic bubble domain chips in which only one critical masking step is required.

It is another object of this invention to provide a process for fabricating a magnetic bubble domain chip having contiguous propagation elements, requiring a minimum number of masking steps.

It is still another object of the present invention to provide a high density magnetic bubble domain chip having components for generation, reading, propagation, transfer, and annihilation, all of which components do not require a resolution less than about 4d, where d is the bubble domain diameter.

It is a further object of this invention to provide an improved process for fabricating a high density magnetic bubble domain chip using ion implanted propagation elements which are contiguous to one another, magnetic sensors and annihilators, and current carrying lines for generation, sensing, and transfer.

It is another object of this invention to provide a bubble domain memory having improved means for transfer of information from one storage register to another.

BRIEF SUMMARY OF THE INVENTION

This magnetic bubble domain memory system is characterized by the use of metallurgy that serves a dual function and by an improved gate for transferring information from one storage register to another. Furthermore, this memory is characterized by a high density stretcher-replicator-sensor design which is especially useful for reading very small (submicron) magnetic bubble domains.

In a preferred embodiment, the memory is comprised of ion implanted propagation regions which serve to define propagation elements in a major/minor loop memory organization. The conductor metallurgy (typically gold) serves not only conductor functions but also serves as a mask for protecting regions of the underlying bubble domain medium which are not to be ion implanted. Thus, the gold provides current carrying conductor functions and also is an ion implantation mask.

The improved transfer gate is used to transfer information from the major loop into the minor loops, or vice versa. It is comprised of permalloy bridges which provide guides for the transfer of information between the major and minor loops in response to current in a conductor. Because the permalloy bridges aid the transfer operation, the transfer conductors can be defined from a continuous conducting layer using the same mask that is used to define the regions which are to be ion implanted. Because of this, the conductor metallurgy can be provided early in the fabrication process, rather than having to be provided through the use of a critically aligned mask after ion implantation has been completed.

Generally, the bubble domain medium is any magnetic medium which will support bubble domains, and is preferably a material having garnet structure. After this, a continuous layer of the magnetic material used for functions such as sensing and transfer bridging is deposited as a continuous layer over the entire substrate. This layer is typically NiFe which also serves as a conductor plating base. A resist material is used to protect regions of the NiFe layer which are not to have a conductor deposited on them. A conductor (Au) is then plated over the NiFe layer. The Au serves as the current carrying conductors and also as an ion implantation mask.

The bubble domain material is then ion implanted through the gold mask to define propagation elements in the major loop and minor loops. Then, a second masking step is used to define the conductor metallurgy, that is, to define and isolate the separate current carrying conductors from one another. Sputter etching is used to remove the gold and NiFe in order to leave the desired conductors and to remove conducting material from those regions of the magnetic chip where it is not desired. Thus, the magnetoresistive sensor (NiFe), the annihilators, and the magnetic bridges have no conductors deposited on them.

These and other objects, features, and advantages of the present invention will be more apparent from the following more particular description of the preferred embodiments.

BRIEF DESCRIPTION OF THE DRAWINGS

FIG. 2F is a side elevation view in cross-section taken along line 2F-2F of FIG. 1.

DETAILED DESCRIPTION OF THE PREFERRED EMBODIMENTS

FIG. 1

Figure 1:
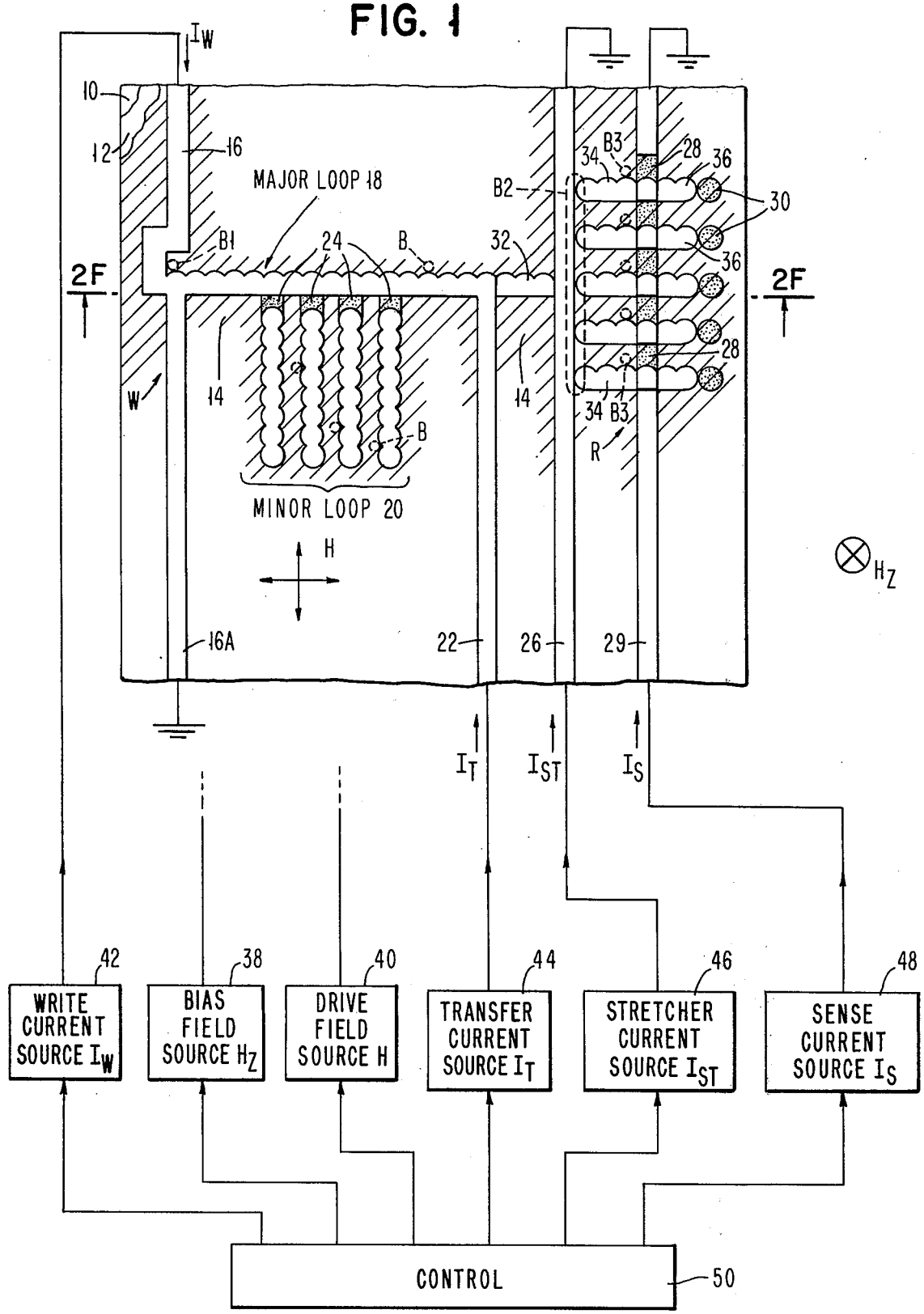
FIG. 1 is a top view of a magnetic bubble domain memory system organized as a major/minor loop memory, in accordance with the principles of the present invention.

FIG. 1 shows a major/minor loop memory organization which can be made using two masking steps. In this embodiment, ion implantation is used to make contiguous propagation elements along which the bubble domains are propagated in response to a magnetic field H which reorients in the plane of magnetic medium 10.

In more detail, a magnetic medium 10 capable of supporting magnetic bubble domains therein has a non-magnetic spacer layer 12 located thereover. Magnetic medium 10 can be comprised of any known bubble material, such as a rare earth iron garnet. Layer 12 is a non-magnetic spacer layer used to prevent etching of the bubble domain material during subsequent processing steps, such as sputter etching. Also, spacer 12 prevents spontaneous nucleation of bubbles in layer 10. A typical thickness of layer 12 is 4,000 Angstroms.

The memory of FIG. 1 provides the functions of write, read, propagate (storage), transfer between storage elements, and annihilation. All portions of magnetic medium 10 which are ion implanted are shown by cross-hatched regions 14. All other regions of magnetic layer 10 are not ion implanted.

Functionally, the write circuit W used to nucleate bubble domains in magnetic layer 10 is comprised of a conductor 16 which returns to ground along a portion 16A thereof. A current pulse $I_W$ in conductor 16 will nucleate a bubble domain B1 in the U-shaped portion of this conductor.

The storage area of the memory is comprised of the major loop 18 and the various minor loops 20. Bubble domains B move along the major loop 18 and minor loops 20 in response to the reorientation of a magnetic field H in the plane of magnetic medium 10. These domains B move in contact with the edges of the ion implanted regions of bubble material 10. In FIG. 1, the major loop does not move magnetic domains along a continuous path defining a closed loop, but rather moves the domains from write circuit W to a read circuit generally designated R.

In order to transfer bubble domains B between the major loop 18 and the minor loops 20, a transfer conductor 22 is provided. Conductor 22 overlays a portion of the major loop 18 and then returns to ground along conductor 16A. That is, write conductor 16 and transfer conductor 22 share a common electrical path along portion 16A. Located between major loop 18 and each of the minor loops 20 are magnetic bridges 24. Typically these bridges are comprised of the same material, such as NiFe, that is used for other functions in the memory. In response to a current pulse $I_T$ in conductor 22, bubble domains will be transferred between the major loop and the various minor loops. The direction of transfer depends upon the direction of current in conductor 22.

Prior to entering the read circuit R, bubble domains traveling along major loop 18 are stretched to an elongated shape, illustrated by domain B2, in response to a current $I_{ST}$ in stretcher conductor 26. As the elongated domain B2 continues to move toward the right to read circuit R, it will be split into a plurality of bubble domains such as B3, which travel along the edges of ion implanted regions 14 to read circuit R and are then cumulatively sensed to provide an amplified output signal.

Read circuit R is comprised of a plurality of sense elements 28 which are connected in a manner to provide a cumulative output signal representing the combined effects of the bubble domains B3. In a preferred embodiment, sense elements 28 are comprised of a magnetoresistive material such as permalloy (a trademark of Allegheny Ludlum Corp.). Electrical conductor 29 provides a sense current $I_S$ through the series connected sense elements 28. Thus, a bubble domain moving to the area of the stretcher line 26 will be elongated and then split to provide a plurality of domains which individually are detected by read circuit R. This provides an amplified output and is therefore suitable for detection of very small magnetic bubble domains, such as submicron magnetic bubble domains.

After being detected, the domains B3 continue to move to the right where they are trapped by the annihilators 30. These annihilators are typically comprised of a soft magnetic material, such as NiFe, which traps the domains. Because this is a destructive read-out memory, the write circuit W is then activated to provide new bubble domain data corresponding to the data just read.

As will be apparent from the fabrication steps illustrated in FIGS. 2A–2F, certain regions of the magnetic bubble domain system will have overlying layers of magnetic material and conductive material, while other areas will not have these overlying layers. In particular, the bridges 24, sense elements 28, and annihilators 30, indicated by speckled regions, will have no conductive layer over them. In a typical embodiment, bridges 24, sense elements 28, and annihilators 30 are comprised of NiFe which is initially deposited as a continuous layer over the entire substrate 12. It should be noted that the cross-hatching for the ion implanted regions 14 extends under the bridges 24, sense elements 28, and annihilators 30. The presence of this ion implantation does not impair the performance of the functions achieved by the bridges 24, sense elements 28, and annihilators 30.

The portion 32 of the major loop 18 (that is, the region of major loop 18 between transfer conductor 22 and stretcher conductor 26) has no overlying magnetic layer and conductive layer in the final memory organization. This is also true in regions 34 and 36. That is, in regions 34 located between stretcher line 26 and sense conductor 30, there is no overlying layer of magnetic material or conductive material. Further, in regions 36 of the propagation elements located between sense conductor 29 and annihilators 30, there is no overlying magnetic or conductive layer.

The bias field $H_z$ used to stabilize the size of domains in magnetic medium 10 is provided by the bias field source 38. This could be any of a number of well known components, such as current carrying coils or permanent magnets. The magnetic drive field H used to move domains along the edges of the ion implanted regions is provided by the drive field source 40. Generally this is a combination of X and Y current carrying coils for establishing magnetic fields that reorient in the plane of magnetic medium 10.

The write current $I_W$ is produced by a write current source 42, while the transfer current $I_T$ is provided by a transfer current source 44. The stretcher current $I_{ST}$ is provided by a stretcher current source 46 while the sense current $I_S$ is provided by a sense current source 48. The magnetic field sources 38 and 40, as well as all of the current sources 42, 44, 46, and 48 are activated under control of a circuit 50, which is any type of well known electronic circuitry for providing timing pulses to synchronize the operation of the various current sources. For example, after a bubble domain (or absence of a domain) is sensed by read circuit R, a signal is provided to the write current source 42 to either provide a nucleating current $I_W$ in conductor 16, or not, depending upon whether or not a bubble was present at read circuit R.

In operation, data is written into major loop 18 by the presence or absence of the current $I_W$ in nucleating write conductor 16. If current $I_W$ is present, a domain B1 will be nucleated at the location shown and will move to major loop 18 as field H reorients. The data thus generated propagates to the right in response to the reorientation of field H. When the desired data is written into loop 18, it can be transferred to the minor loops 20 by a current $I_T$ in conductor 22. Depending upon the direction of this current, transfer occurs from the major loop 18 to the minor loops 20 or vice versa. Nucleation and transfer between major loop 18 and minor loops 20 can occur at the same time.

When information is to be read from the minor loops 20, a current pulse $I_T$ is provided in conductor 22. This transfers the bubble domain pattern to the major loop 18 after which it propagates to the right as field H reorients. When this information reaches the stretcher conductor 26, a current $I_{ST}$ is provided in conductor 26 which elongates any bubble domain in the data pattern. The elongated domain then moves to the right along the edges of ion implanted regions 14 surrounding areas 34. The elongated domain is split into the domains B3 which then pass under the sense elements 28. A signal is produced in an associated sense amplifier (not shown) which indicates whether the data was the presence or absence of a bubble domain. If the data were a bubble domain, the split domains B3 would be transferred along the edges of regions 36 to the annihilators 30 where they would be trapped.

The sense elements 28 can typically be magnetoresistive sense elements electrically connected in series. As is known by referring to U.S. Pat. No. 3,691,540, these elements will undergo a resistance change when the stray magnetic field of a bubble domain is coupled to them. This resistance change can be detected as a voltage change across all of the series connected sense elements, in order to provide an indication of the presence and absence of bubble domains in flux coupling proximity to the sense elements.

Depending upon whether or not the data consists of bubble domains, a signal will be provided by the control circuit 50 to the write current source 42. This signal will activate source 42 if it is desired to nucleate a new bubble domain to take the place of a bubble domain just detected in the output data.

Thus, the major/minor loop memory of FIG. 1 is characterized by the use of conductors 16, 22, 26, and 29 which serve as ion implantation masks in addition to their functions as current carrying elements. This memory is also characterized by the use of magnetic bridges between the major loop 18 and the various minor loops 20. Still further, a stretcher-replicator-sensor arrangement is provided which can be fabricated in a minimum number of masking steps.

FABRICATION PROCESS (FIGS. 2A–2F)

These Figures illustrate typical fabrication steps used to provide the memory of FIG. 1. In particular, FIG. 2F is a side elevational view of the major/minor loop memory of FIG. 1 taken along line 2F—2F.

Figure 2A:
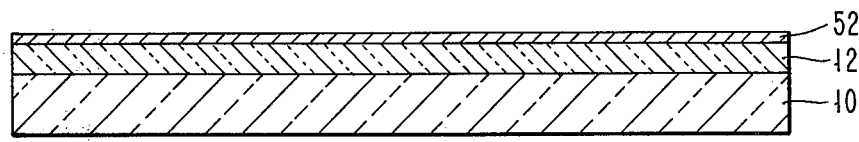
FIGS. 2A-2F are side elevation views illustrating the process used to make the memory of FIG. 1. In particular.

FIG. 2A shows the magnetic bubble material 10 having a non-magnetic spacer layer 12 thereover. A continuous layer 52 of magnetic material is deposited over the entire underlying layer 12. Layer 52 is a magnetic material such as NiFe. It is used as a conductive plating base and also for the magnetic elements, such as the magnetic bridges 24, sense elements 28, and annihilators 30.

Figure 2B:
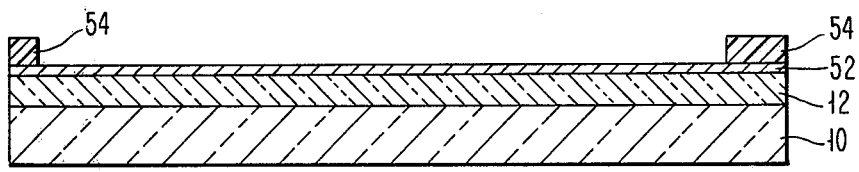

In FIG. 2B, a patterned resist layer 54 is formed on layer 52, in order to protect those areas which are not to be covered by a conductive layer. More specifically, resist 54 protects the magnetic bridges 24, sense elements 28, and annihilators 30, and all areas 14 of the magnetic medium which are to be ion implanted.

Figure 2C:
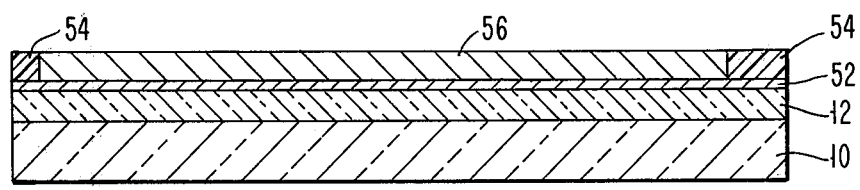

In FIG. 2C, an ion implantation mask is provided by plating a metal 56, such as gold, over the underlying magnetic layer 52. The plated gold is the conductors 16, 22, 26, and 29. Thus, layer 52 provides certain device functions and also serves as a plating base when forming the ion implantation mask. The various conductors 16, 22, 26, and 29 are later isolated from one another in an etching step.

Figure 2D:
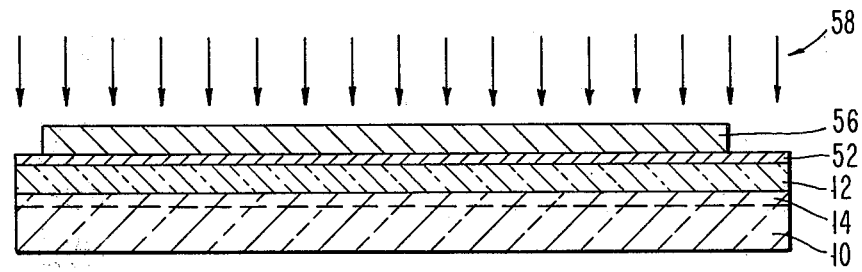

In FIG. 2D, resist layer 54 is removed and the magnetic material 10 is ion implanted using masking layer 56. The ion implantation is indicated by the arrows 58. This step can be provided using well known techniques employing protons or boron ions. During ion implantation, regions 14 of magnetic layer 10 will be implanted.

Figure 2E:
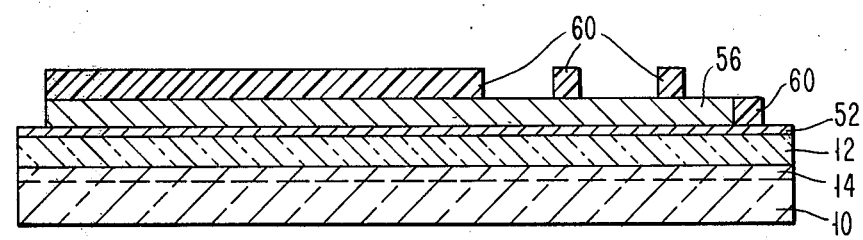
Figure 2F:
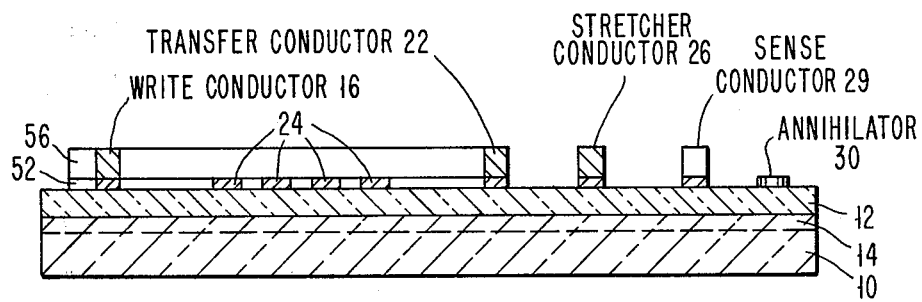

In FIG. 2E, a second masking step is shown. A patterned resist layer 60 is used to electrically isolate the write conductor 16, transfer conductor 22, stretcher conductor 26, and sense conductor 29. Therefore, portions of the magnetic layer 52 and conductive layer 56 are removed in regions 32, 34, and 36 (FIG. 1) in order to electrically isolate and define conductors 22, 26, and 29.

FIG. 2F is a side view of the completed structure. As is apparent, only two masking steps have been used and only the second of these requires any kind of alignment. Thus, a major/minor loop memory having functions of write, read, storage, transfer and annihilation has been provided using contiguous propagation elements by a process involving only two masking steps.

It will be appreciated by those of skill in the art that various alternatives exist in this process and that the order of the processing steps can be interchanged. For instance, the gold layer 56 can be evaporated or sputtered rather than being electroplated. Further, the gold layer can be deposited prior to deposition of the NiFe layer 52. As an example, a layer of gold can be deposited over $SiO_2$ layer 12, after which the gold layer is etched to form the conductors which are part of the ion implantation mask. The gold is also removed from the areas of the underlying $SiO_2$ layer where the sensors, magnetic bridges, and annihilators are to be formed. After this, the magnetic medium is ion implanted and a continuous NiFe layer is deposited over the entire substrate. A mask is then formed to define the magnetic bridges, sensors, and annihilators and also to electrically isolate the conductors 16, 22, 26, and 29.

Thus, it will be appreciated that many variations of the basic process can be envisioned by those of skill in the art. Whatever the sequence of the processing steps, the process is characterized in that the conductors are used for both the ion implantation mask and for current carrying functions, and that the transfer means for transferring information between the minor loops 20 and the major loop 18 are comprised of magnetic bridges.

While the principles of the present invention provide advantages which are even more apparent when contiguous propagation elements defined by ion implanted regions are utilized, it should be evident that the propagation elements need not be contiguous with one another in order to practice this invention. Further, the materials used for the various regions of the bubble domain memory can be different than those illustrated, and other geometries can be used for the propagation elements, whether or not they are contiguous.

What is claimed is:

1. A magnetic bubble domain device for storing information represented by bubble domains in a magnetic medium, comprising:
   a first shift register along which bubble domains propagate in response to a reorienting magnetic field in the plane of said magnetic medium,
   at least one storage shift register separated from said first shift register for storing information represented by said bubble domains,
   said first shift register and said at least one storage shift register being comprised of ion implanted regions of said magnetic medium along which said bubble domains propagate in response to the reorientation of said magnetic field,
   transfer means for transferring said information between said first shift register and said at least one storage shift register, said transfer means including:
   a magnetic bridge which is comprised of a magnetically soft material bridging the separation between said first shift register and said at least one storage shift register, and
   an electrical conductor whose edges are substantially aligned with the edges of said ion implanted regions comprising said first shift register and which overlies non ion implanted regions of said magnetic medium, said electrical conductor being disposed along the length of said first shift register,
   wherein at least a portion of said magnetic medium in the area of separation between said first shift register and said storage shift register is ion implanted,
   write means for producing bubble domains for representation of said information,
   read means for reading said information.

2. The device of claim 1, where said read means includes:
   means for expanding said bubble domain to be read,
   means for replicating said expanded bubble domain into a plurality of bubble domains,
   means for sensing said plurality of bubble domains to provide an amplified signal representative of said bubble domain to be read.

3. The device of claim 2, where said means for expanding is a current carrying conductor and said means for sensing is comprised of a plurality of series connected sensing elements.

4. The device of claim 3, where said sensing elements and said magnetic bridge are comprised of the same material.

5. The device of claim 4, where said sense elements and said magnetic bridge are portions of the same magnetic layer.

6. The device of claim 1, where said write means and said read means are adjacent to said first shift register for writing information into said first shift register and for reading information from said first shift register.

7. The device of claim 1, where said magnetic medium is ion implanted in areas surrounding the spatial extent of said electrical conductor in said transfer means.

8. A magnetic bubble domain device for storage of magnetic bubble domains in a magnetic medium comprising:

first and second shift registers for movement of magnetic bubble domains in said magnetic medium, said shift registers being comprised of ion implanted regions in a magnetic layer, a conductive layer used to define the areas of said magnetic layer which are ion implanted, a portion of said conductive layer overlying non ion implanted regions of said magnetic layer, the edges of said conductive layer being aligned with the edges of said ion implanted regions comprising said first shift register, a patterned magnetic layer to at least a portion of which electrical contact is made by said conductive layer to define a sense element for detection of magnetic bubble domains in said magnetic medium, another portion of said patterned magnetic layer being located between said first and second shift registers forming a magnetic bridge therebetween, a bubble domain generator comprising a portion of said conductive layer through which a current passes for generating said bubble domains, a transfer means for transferring bubble domains between said first and second shift registers, said transfer means including a portion of said conductive layer through which electrical current passes to implement transfer between said first and second shift registers.

9. The device of claim 8, where said patterned magnetic layer located between said first and second shift registers is located over a portion of said magnetic medium that is ion implanted.

10. The device of claim 8, where said conductive layer is formed on said patterned magnetic layer.

11. The device of claim 8, including means for elongating bubble domains from said first shift register and means for splitting said elongated bubble domains.

12. A magnetic bubble domain device for storage of magnetic bubble domains in a magnetic medium, comprising:

first and second shift registers for movement of magnetic bubble domains in said magnetic medium, said shift registers being comprised of ion implanted regions forming contiguous propagation elements along which said bubble domains move, a layer of conductive material overlying a non ion implanted region, the edges of said conductive material being aligned with the edges of said propagation elements and defining the boundary of said ion-implanted regions, at least a first portion of said layer of conductive material extending in a direction along the direction of said first shift register, transfer means for transferring bubble domains between said first and second shift register, said transfer means including said first portion of said conductive material lying along the direction of said first shift register and a magnetic bridge located between said first and second shift registers, the presence of current in said conductive material determining bubble domain transfer between said first and second shift registers.

13. The device of claim 12, where sid layer of conductive material includes a second portion thereof for carrying electrical current for generation of bubble domains in said magnetic medium.

14. The storage device of claim 13, where said first shift register provides a propagation path for movement of generated bubble domains to said transfer means.

15. The device of claim 13, where said second portion of said layer of conductive material used to generate bubble domains in said magnetic medium is located ajacent to said first shift register, said generated bubbles being generated adjacent to said first shift register.

16. The device of claim 12, further including a layer of magnetic material to which electricl contact is made by a third portion of said layer of conductive material to define a sense element for detection of bubble domains in said magnetic medium.

17. The storage device of claim 16, including an ion-implanted region between said first and second shift registers.

18. The storage device of claim 12, where said first portion of said layer of conductive material forming a portion of said transfer means is self-aligned with said ion implanted regions forming said first shift register.

19. A magnetic bubble domain storage device, comprising:

a magnetic medium in which bubble domains can be moved, a first shift register for movement of magnetic bubble domains in said magnetic medium, said first shift register including contiguous propagation elements along which said magnetic domains move in response to the reorientation of a magnetic field in the plane of said magnetic medium, said first shift register having a layer of conductive material thereover and magnetic regions which are ion implanted, the edges of said conductive material being aligned with the edges of said ion-implanted regions, a second shift register spatially separate from said first shift register and having contiguous propagation elements defined by ion implanted magnetic regions along the edges of which said bubble domains propagate in response to the reorientation of said magnetic field, wherein said conductive material does not overlap the gap between said first and second shift registers, and a self-aligned transfer means for tranferring bubble domains between said first and second shift register, said transfer means including said layer of conductive material and a magnetic bridge between said first and second shift registers along which said bubble domains pass to effect transfer therebetween, said transfer being determined by the presence of electrical current in said layer of conductive material.

20. The device of claim 19, further including a current controlled bubble domain generator for generating magnetic bubble domains in said magnetic medium, said first shift register providing a propagation path for movement of said bubble domains from said generator to said transfer means.

21. The storage device of claim 20, including a plurality of said second shift registers, there being one of said transfer means between each said second shift register and said first shift register, each of said transfer means including said layer of conductive material, there being a magnetic bridge between said first shift register and each of said second shift registers.

22. A magnetic bubble domain storage device comprising:

a magnetic medium in which said bubble domains can be moved, a first shift register including contiguous propagation elements along the edges of which said bubble domains move in response to the reorientation of a magnetic field substantially in the plane of said magnetic medium, where the edges of said propagation elements are defined by and aligned with the edges of a layer of non magnetic, electrically conductive material, which is used as a mask in the formation of said contiguous propagation elements, a second shift register separated from said shift register and comprised of contiguous propagation elements along the edges of which said bubble domains propagate in response to the reorientation of said magnetic field, a transfer means for transferring bubble domains between said first and second shift registers, said transfer means including a current carrying path comprised of said conductive material and a magnetic bridge located between said first and second shift registers, transfer of domains between said first and second shift registers being determined by the presence of current in said conductive material.

23. The device of claim 22, where said contiguous propagation elements in said first and second shift registers are ion implanted magnetic regions formed by ion-implantation using said layer of conductive material as an ion-implantation mask, said layer being sufficient to substantially block said ions.

24. A magnetic bubble domain storage device comprising:

a magnetic medium in which said bubble domains can be moved, a first shift register comprised of contiguous propagation elements along the edges of which said bubble domains move in response to the reorientation of a magnetic field substantially in the plane of said propagation elements, a second shift register separated from said first shift register by a gap and comprised of contiguous propagation elements along the edges of which said bubble domains move in response to the reorientation of said magnetic field, a layer of non magnetic, electrically conductive material which overlies said first shift register and whose edge is aligned with the edges of said contiguous propagation elements comprising said first shift register, no portion of said non magnetic, electrically conductive layer extending over said gap between said first and second shift registers, transfer means for transferring bubble domains between said first and second shift registers, said transfer means including the portion of said electrically conductive, non magnetic layer located over and having an edge aligned with the edge of said first shift register, the presence of current in said electrically conductive material controlling the transfer of domains between said first and second shift registers.

25. A magnetic bubble domain device, comprising:
a magnetic medium in which said bubble domains can be moved,
a first shift register comprised of contiguous propagation elements along the edges of which said bubble domains move in response to the reorientation of a magnetic field substantially in the plane of said propagation elements,
a second shift register separated from said first shift register by a gap and comprised of contiguous propagation elements along the edges of which said bubble domains move in response to the reorientation of said magnetic field, a layer of non-magnetic, electrically conductive material which overlies said first shift register and whose edges are aligned with the edges of said contiguous propagation elements comprising said first shift register, transfer means for transferring bubble domains between said first and second shift registers, said transfer means including the portion of said electrically conductive, non-magnetic layer located over and having an edge aligned with the edge of said first shift register, the presence of current in said electrically conductive material controlling the transfer of domains between said first and second shift registers, generator means for generating bubbles along said first shift register, said generator means including a second portion of said non-magnetic, electrically conductive layer, said second portion located over and having an edge aligned with an edge of said first shift register, the presence of current in said second portion controlling the generation of domains along a path defined by said first register.

26. The device of claim 25, where said contiguous propagation elements comprised of ion implanted regions of a magnetic layer, the boundaries of said ion implanted regions being defined by said layer of non-magnetic, electrically conductive material, said first and second portions of said electrically conductive layer being self-aligned with said first shift register.

27. The device of claim 25, further including stretching means for stretching a bubble domain, said stretching means being comprised of a third portion of said non-magnetic, electrically conductive layer which is self-aligned with said first shift register, current through said third portion causing a bubble domain near said third portion to be stretched in a direction along said third portion.

28. A magnetic bubble domain device for storage of magnetic bubble domains in a magnetic medium, comprising:

first and second shift registers for movement of magnetic bubble domains in said magnetic medium in response to the reorientation of a magnetic field substantially in the plane of said first and second shift registers, said shift registers being comprised of ion implanted regions of a magnetic layer forming contiguous propagation elements along which said bubble domains move as said magnetic field reorients, a layer of non-magnetic, electrically conductive material overlying a non-ion implanted region of said magnetic layer, the edges of said conductive layer being aligned with the edges of said propagation elements and defining the boundary of said ion implanted regions, at least a first portion of said layer of conductive material extending in a direction along the direction of said first shift register, transfer means for transferring bubble domains between said first and second shift registers, said transfer means including said first portion of said conductive material lying along the direction of said first shift register, the presence of current in said conductive material defining said first portion determining domain transfer between said first and second shift registers, a self-aligned generator means for generating bubbles along a propagation edge of said first shift register, said generator means including a second portion of said electrically conductive layer, said second portion being aligned with a propagation edge of said first shift register and being self-aligned with said propagation edge, the presence of current in said second portion determining domain generation along said propagation edge of said first shift register that is aligned with the edge of said second portion of said electrically conductive layer.

29. The device of claim 28, further including stretching means for stretching a bubble domain, said stretching means being comprised of a third portion of said electrically conductive layer, the presence of current in said third portion causing a bubble domain located near said third portion to be stretched along said third portion.

* * * * *